United States Patent
Balakrishnan et al.

(10) Patent No.: US 10,090,384 B2
(45) Date of Patent: Oct. 2, 2018

(54) TENSILE STRAINED NFET AND COMPRESSIVELY STRAINED PFET FORMED ON STRAIN RELAXED BUFFER

(71) Applicant: INTERNATIONAL BUSINESS MACHINES CORPORATION, Armonk, NY (US)

(72) Inventors: Karthik Balakrishnan, White Plains, NY (US); Keith E. Fogel, Hopewell Junction, NY (US); Pouya Hashemi, White Plains, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/403,856

(22) Filed: Jan. 11, 2017

(65) Prior Publication Data

US 2017/0229542 A1   Aug. 10, 2017

Related U.S. Application Data

(62) Division of application No. 15/017,720, filed on Feb. 8, 2016, now Pat. No. 9,905,649.

(51) Int. Cl.
  *H01L 29/10* (2006.01)
  *H01L 29/78* (2006.01)
  (Continued)

(52) U.S. Cl.
  CPC ...... *H01L 29/1054* (2013.01); *H01L 21/0245* (2013.01); *H01L 21/02532* (2013.01);
  (Continued)

(58) Field of Classification Search
  CPC .......................... H01L 27/092–27/0928; H01L 21/8238–21/823892; H01L 29/7842–29/7849; H01L 29/1054; H01L 29/785; H01L 29/16; H01L 29/0649; H01L 21/02532
  See application file for complete search history.

(56) References Cited

U.S. PATENT DOCUMENTS 6,111,267 A   8/2000  Fischer et al.
7,060,632 B2  6/2006  Fitzgerald et al.
(Continued)

OTHER PUBLICATIONS

K. Cheng et al., "High Performance Extremely Thin SOI (ETSOI) Hybrid CMOS with Si Channel NFET and Strained SiGe PFET," IEEE IEDM, 2012, pp. 419-422.

*Primary Examiner* — Mohsen Ahmadi
(74) *Attorney, Agent, or Firm* — Daniel P. Morris, Esq.; Otterstedt, Ellenbogen & Kammer, LLP

(57) ABSTRACT

A tensile strained silicon layer and a compressively strained silicon germanium layer are formed on a strain relaxed silicon germanium buffer layer substrate. A relaxed silicon layer is formed on the substrate and the compressively strained silicon germanium layer is formed on the relaxed silicon layer. The compressively strained silicon germanium layer can accordingly have approximately the same concentration of germanium as the underlying strain relaxed buffer layer substrate, which facilitates gate integration. The tensile strained silicon layer and the compressively strained silicon germanium layer can be configured as fins used in the fabrication of FinFET devices. The relaxed silicon layer and a silicon germanium layer underlying the tensile silicon layer can be doped in situ to provide punch through stop regions adjoining the fins.

8 Claims, 9 Drawing Sheets

(51) Int. Cl.
*H01L 29/06* (2006.01)
*H01L 29/165* (2006.01)
*H01L 21/84* (2006.01)
*H01L 21/225* (2006.01)
*H01L 21/02* (2006.01)
*H01L 27/092* (2006.01)
*H01L 21/8238* (2006.01)
*H01L 21/762* (2006.01)

(52) U.S. Cl.
CPC .... *H01L 21/2253* (2013.01); *H01L 21/76224* (2013.01); *H01L 21/823807* (2013.01); *H01L 21/823821* (2013.01); *H01L 21/823878* (2013.01); *H01L 21/845* (2013.01); *H01L 27/0924* (2013.01); *H01L 29/0615* (2013.01); *H01L 29/0649* (2013.01); *H01L 29/165* (2013.01); *H01L 29/785* (2013.01)

(56) References Cited

U.S. PATENT DOCUMENTS

| | | | |
|---|---|---|---|
| 8,138,543 B2 | 3/2012 | Cheng et al. | |
| 8,183,627 B2 | 5/2012 | Currie | |
| 8,319,285 B2 * | 11/2012 | Tilke | H01L 21/76251 257/255 |
| 8,486,776 B2 | 7/2013 | Bedell et al. | |
| 8,951,870 B2 | 2/2015 | Basker et al. | |
| 8,975,168 B2 | 3/2015 | Liu et al. | |
| 9,093,533 B2 | 7/2015 | Cheng et al. | |
| 9,570,298 B1 * | 2/2017 | Basker | H01L 21/02667 |
| 9,627,267 B2 * | 4/2017 | Balakrishnan | H01L 21/823807 |
| 2014/0353760 A1 | 12/2014 | Loubet et al. | |
| 2015/0311341 A1 * | 10/2015 | Hur | H01L 21/02532 257/190 |
| 2015/0340500 A1 * | 11/2015 | Brunco | H01L 21/02532 257/190 |
| 2016/0027876 A1 * | 1/2016 | Lee | H01L 29/1054 257/369 |
| 2016/0104799 A1 * | 4/2016 | Qi | H01L 29/7849 257/29 |
| 2016/0190304 A1 * | 6/2016 | Morin | H01L 29/785 257/347 |
| 2016/0233319 A1 * | 8/2016 | Lu | H01L 29/66795 |
| 2016/0254195 A1 * | 9/2016 | Jacob | H01L 21/823821 438/221 |
| 2017/0077231 A1 * | 3/2017 | Balakrishnan | H01L 29/1054 |
| 2017/0125551 A1 * | 5/2017 | Cheng | H01L 29/66795 |
| 2017/0125578 A1 * | 5/2017 | Cheng | H01L 29/785 |
| 2017/0170014 A1 * | 6/2017 | Basker | H01L 21/02667 |

* cited by examiner

TENSILE STRAINED NFET AND COMPRESSIVELY STRAINED PFET FORMED ON STRAIN RELAXED BUFFER

CROSS-REFERENCE TO RELATED APPLICATIONS

This patent application is a divisional of U.S. patent application Ser. No. 15/017,720 filed Feb. 8, 2016, entitled "TENSILE STRAINED NFET AND COMPRESSIVELY STRAINED PFET FORMED ON STRAIN RELAXED BUFFER." The complete disclosure of the aforementioned U.S. patent application Ser. No. 15/017,720 is expressly incorporated herein by reference in its entirety for all purposes.

BACKGROUND

The present disclosure relates generally to the electrical, electronic and computer arts and, more particularly, to nFET and pFET devices formed on strain relaxed buffers and the fabrication of such devices.

Various semiconductor devices benefit from the use of strain-relaxed buffer layers such as those comprising fully relaxed silicon germanium (SiGe). Strain-relaxed buffers (SRBs) can act as virtual substrates on which to grow semiconductor layers having lattice constants different from those of the original substrates, for example silicon (001). The SRBs can support strained or relaxed layers. The SRBs should be relaxed to help avoid the generation of crystal imperfections such as threading dislocations in the layer(s) grown thereon. Such defects are known to have deleterious effects on the properties of electronic and optoelectronic devices. The crystalline quality of a relaxed SiGe layer can be improved by, for example, growing compositionally graded buffer layers (GBL) with a thickness of up to several micrometers. Graded buffer layers are grown with increasing germanium concentration as the thickness increases. Molecular beam epitaxy (MBE) is one suitable technique for growing graded SiGe buffer layers. Other techniques are known to the art. As the surface roughness of buffer layers obtained using such a technique may not be optimal, chemical mechanical polishing (CMP) may be necessary. Another technique used for fabricating a relaxed $Si_{1-x}Ge_x$ buffer having reduced levels of threading dislocations includes epitaxially depositing a pseudomorphic or nearly pseudomorphic $Si_{1-x}Ge_x$ layer on the surface of a silicon substrate, ion implanting atoms of a light element into the substrate, and annealing the substrate at a temperature above 650° C. Reduction of threading dislocations (TD) density is obtained by plastic relaxation, which by definition works based on dislocation generation to relax the lattice mismatched crystals.

Exemplary devices that may be formed using strain-relaxed silicon germanium layers include fin-type field-effect transistors (FinFETs), metal oxide field effect transistors (MOSFETs), and strained silicon-based complementary metal oxide semiconductor (CMOS) devices. Some nFET devices require silicon layers under tensile strain to enhance electron mobility. Other devices or elements such as pFET devices require semiconductor layers under compressive strain. The amount of strain on a silicon or silicon germanium layer grown epitaxially on a relaxed $Si_{1-x}Ge_x$ layer can be engineered by providing an atomic percentage of germanium within a selected range. A current technique involves the use of SiGe alloys having, for example, twenty-five percent (25%) germanium in the buffer layer ($Si_{0.75}Ge_{0.25}$) and fifty percent germanium ($Si_{0.5}Ge_{0.5}$) in the adjoining pFET layer. Gate stack fabrication on SiGe alloys containing twenty-five percent (25%) germanium is well understood, but formation of a reliable gate stack on SiGe alloys having higher germanium contents can be challenging. Strain relaxed buffer layers allow dual channel materials to be provided on the same substrate employed to fabricate integrated circuits including, for example, FinFET devices.

FIGS. 1-4 schematically illustrate an exemplary sequence of steps for forming a finned structure useful for forming FinFET devices on a bulk silicon substrate. FIG. 1 shows a structure 20 including a bulk silicon substrate 22 and a strain relaxed buffer (SRB) layer 24 on the substrate. The SRB layer is a silicon germanium layer, for example ($Si_{0.75}Ge_{0.25}$). The SRB layer is subjected to ion implantation to form a p-well region 26 in the nFET region of the structure and an n-well region 28 in the pFET region of the structure 20. Boron ions 27 are implanted to form the p-well region 26 while the pFET region is masked. Arsenic ions 29 are used to form the n-well region 28 while the nFET region is masked. As known in the art, punch through stop (PTS) implantation reduces the punch through current in FinFET devices formed using bulk silicon substrates. As shown in FIG. 2, a silicon layer 30 is grown epitaxially on the p-well in the nFET region of the structure while the pFET region is masked and a silicon germanium layer 31 is grown on the n-well region 28 while the nFET region is masked. The silicon germanium layer may have the composition $Si_{0.60}Ge_{0.40}$ and will accordingly be under compressive strain when grown on an SRB layer having a lower percentage of germanium. The silicon layer 30 is under tensile strain. Fins 32, 33 are formed from the silicon and silicon germanium layers 30, 31, respectively. Fins having relatively small widths, for example six to ten nanometers (6-10 nm), can be formed using sidewall image transfer (SIT) processes. Photolithographic processes can be employed for forming fins having relatively large widths. Portions of the p-well and n-well may be removed during fin formation, as schematically illustrated, leaving PTS regions at the bottom portions of the fins. While shown as having vertical side walls, the fins may instead have generally triangular configurations with wider bases than top portions. The spaces between fins are partially filled with a dielectric material such as silicon dioxide. The deposited dielectric material is etched back to form a dielectric layer 34 of desired thickness. The heights of the fins are determined by the thickness of the dielectric layer 34, as schematically illustrated in FIG. 4.

Conventional process flows relating to the fabrication of finned semiconductor devices includes steps such as ion implantation and annealing. Problems may arise from damage caused by ion implantation in the SiGe SRB, leading to defect nucleation and defect movement. Such defects 35 are schematically illustrated in FIG. 4. (The silicon substrate beneath the SRB layer is not shown in FIGS. 2-4 to simplify the drawings.) Enhanced diffusion of n-doped species used to form the PTS region in the pFET region of the structure increases the difficulty in forming gate stacks on the silicon germanium fins 33. Arsenic has a much higher diffusion rate in silicon germanium than in silicon, leading to unwanted diffusion into the channel regions of the silicon germanium fins 33. Such diffusion is schematically illustrated in FIG. 4. Phosphorus, while having a slower diffusion rate than arsenic, likewise tends to diffuse upward from the PTS region into the channel regions of the silicon germanium fins 33 and laterally into the adjoining p-well region. The formation of reliable gate stacks in the pFET region is more challenging when the fins 33 have been subjected to arsenic or phosphorus diffusion.

Fin-type field-effect transistors (FinFETs) as discussed above have three-dimensional, non-planar configurations including fin-like structures extending above substrates. The substrates may include semiconductor on insulator substrates or bulk semiconductor substrates. In bulk FinFETs, active fin heights are set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures involve the fabrication of a dummy gate followed by fabrication of other transistor elements and replacement of the dummy gate with actual gate materials.

BRIEF SUMMARY

Techniques are provided for providing structures including strained silicon and silicon germanium on a strain relaxed buffer layer substrate.

In one aspect, an exemplary fabrication method includes obtaining a structure including a substrate and a strain relaxed silicon germanium buffer layer on the substrate, forming an epitaxial silicon germanium layer on a first region of the strain relaxed buffer layer, and forming a tensile strained layer comprising silicon directly on the epitaxial silicon germanium layer. A relaxed layer comprising silicon is formed on a second region of the strain relaxed buffer layer and a compressively strained silicon germanium layer is formed directly on the relaxed layer.

In another aspect, an exemplary semiconductor structure includes a strain relaxed silicon germanium layer, a p-doped silicon germanium layer on a first region of the strain relaxed buffer layer, and a relaxed, n-doped layer comprising silicon on a second region of the strain relaxed buffer layer. A tensile strained layer comprising silicon is directly on the p-doped silicon germanium layer and a compressively strained silicon germanium layer is directly on the relaxed, n-doped layer. The tensile strained layer and the compressively strained silicon germanium layers are electrically isolated from each other.

Techniques and structures as disclosed herein can provide substantial beneficial technical effects. By way of example only and without limitation, one or more embodiments may provide one or more of the following advantages:
Improving performance of electronic devices formed on strain relaxed buffer layers;
Facilitating reliable gate stack integration;
Avoiding unwanted diffusion of dopants into fin channel regions.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a structure wherein a strain relaxed silicon germanium buffer is provided for facilitating subsequent growth of high performance CMOS devices. Strained silicon germanium fins can be formed on the buffer during the fabrication of pFET devices while substantially avoiding unwanted dopant diffusion from punch through stop regions using techniques as described herein.

Figure 2:
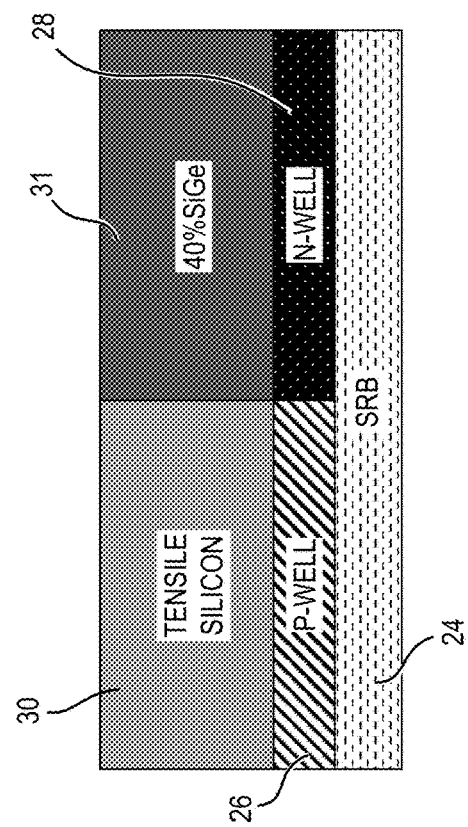
FIG. 2 is a cross-sectional view thereof schematically illustrating formation of silicon and silicon germanium layers on the implanted strain relaxed buffer layer, in accordance with prior art techniques.
Figure 1:
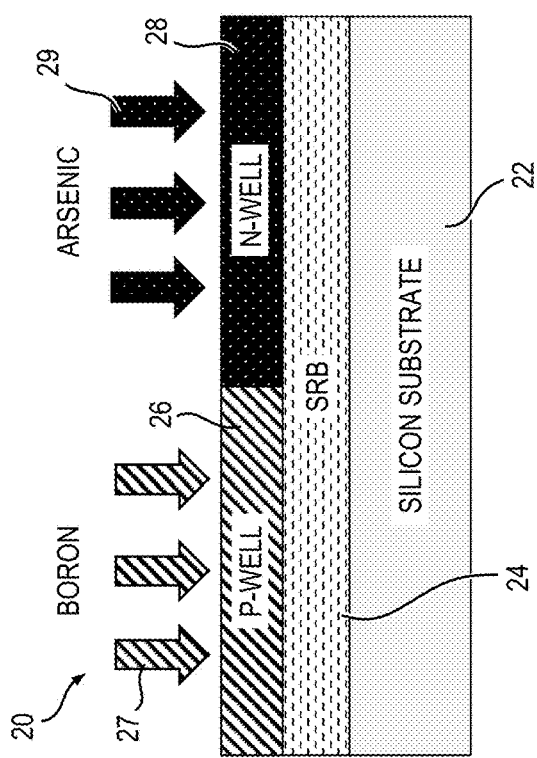
FIG. 1 is a schematic cross-sectional view showing ion implantation of a strain relaxed buffer layer formed on a bulk silicon substrate in accordance with prior art techniques.
Figure 4:
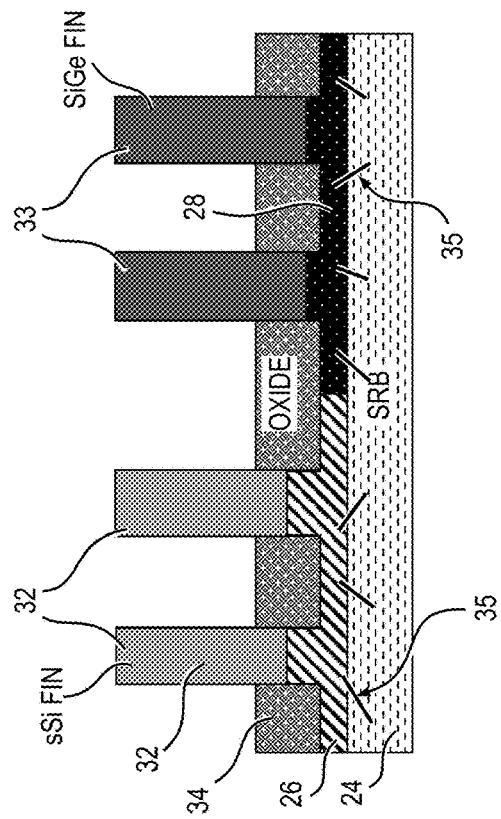
FIG. 4 is a cross-sectional view showing the structure of FIG. 3 following deposition of a dielectric layer and annealing, in accordance with prior art techniques.
Figure 3:
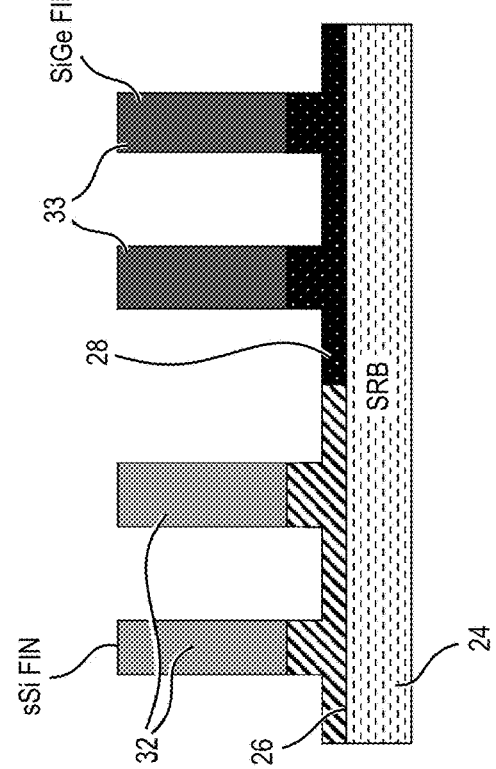
FIG. 3 is a further schematic, cross-sectional view thereof showing formation of semiconductor fins from the silicon and silicon germanium layers, in accordance with prior art techniques.
Figure 5:
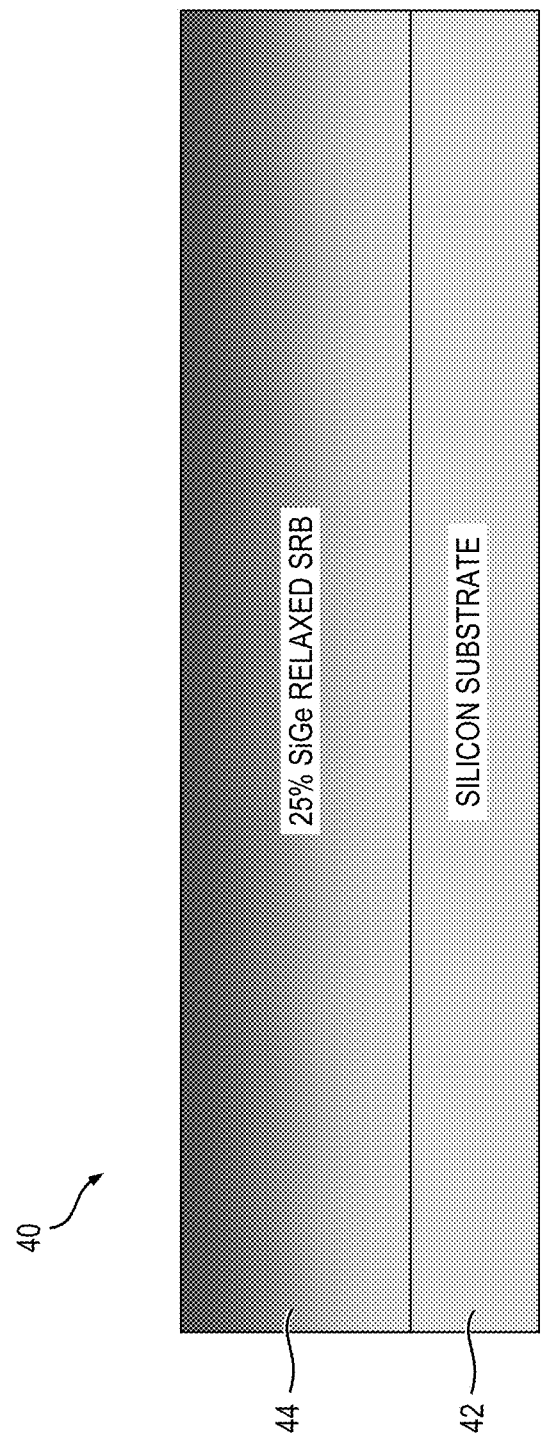
FIG. 5 is a schematic, cross-sectional view showing a semiconductor structure including a strain relaxed $Si_{1-x}Ge_x$ strain relaxed buffer layer on a bulk silicon substrate.

FIGS. 4-11 depict an exemplary process flow for obtaining a finned semiconductor structure usable for the fabrication of FinFET devices. The structure 40 shown in FIG. 4 includes a silicon substrate 42 having a first $Si_{1-x}Ge_x$ layer 44 thereon. In an exemplary embodiment, x=0.25 in at least an upper portion of the $Si_{1-x}Ge_x$ layer 44. A smaller germanium concentration is present in the vicinity of the surface of the substrate 42 on which the $Si_{1-x}Ge_x$ layer is grown. The substrate is a bulk silicon substrate in one or more exemplary embodiments that is essentially undoped and substantially monocrystalline. The exemplary structure 40 shown in FIG. 4 is obtained by growing a substantially undoped, pseudomorphic SiGe layer 44 on the substrate layer 22. The layer is formed using any epitaxial growing process that allows the formation of SiGe layers having the desired pseudomorphic characteristics. In one or more embodiments, low pressure chemical vapor deposition (LPCVD) is employed to grow the SiGe layer 44. Such deposition can be conducted at 10-80 torr and between 600-1,000° C. In some alternative embodiments, an ultra-high-vacuum chemical vapor deposition (UHV-CVD) process may be employed to grow the SiGe layer directly on the substrate surface. For example, a UHV-CVD process is performed at low temperature (e.g. less than 550° C.) on a clean substrate layer surface in some embodiments. Other exemplary growth processes include molecular beam epitaxy (MBE), chemical beam epitaxy (CBE), chemical vapor deposition (CVD), and plasma-enhanced chemical vapor deposition (PECVD). In some embodiments, the ratio of silicon and germanium precursors (e.g. silane and germane) is maintained constant during one or more stages of epitaxial deposition to provide a substantially uniform ratio of silicon to germanium in one or more portions of the first SiGe layer 44. A step graded SiGe layer may be provided using such a deposition technique. Alternatively, the SiGe layer 44 can be formed as a continuously graded layer having increasing germanium content from its interface with the substrate 42 towards the top surface thereof. Defects in the SiGe originate from the lattice mismatch between the silicon substrate and the SiGe grown thereon. By growing relatively thick SiGe layer(s), the defect density at the surface of the SiGe layer is reduced. Defect density at the surface of the SiGe layer 44 is reduced as a function of thickness. Other ways of reducing the defect density in graded buffer layers are also known to those of skill in the art. In one or more exemplary embodiments, the $Si_{1-x}Ge_x$ layer 44 has a value of x between 0.20 and 0.30 in the portion that will later adjoin n-well and p-well layers grown thereon. The thickness of the first $Si_{1-x}Ge_x$ layer 44 is between two and ten microns in some exemplary embodiments. For example, in one embodiment the first $Si_{1-x}Ge_x$ layer 44 has an overall thickness of five microns, at least the top two microns of which include the targeted germanium concentration (x=0.20-0.30).

Figure 6:
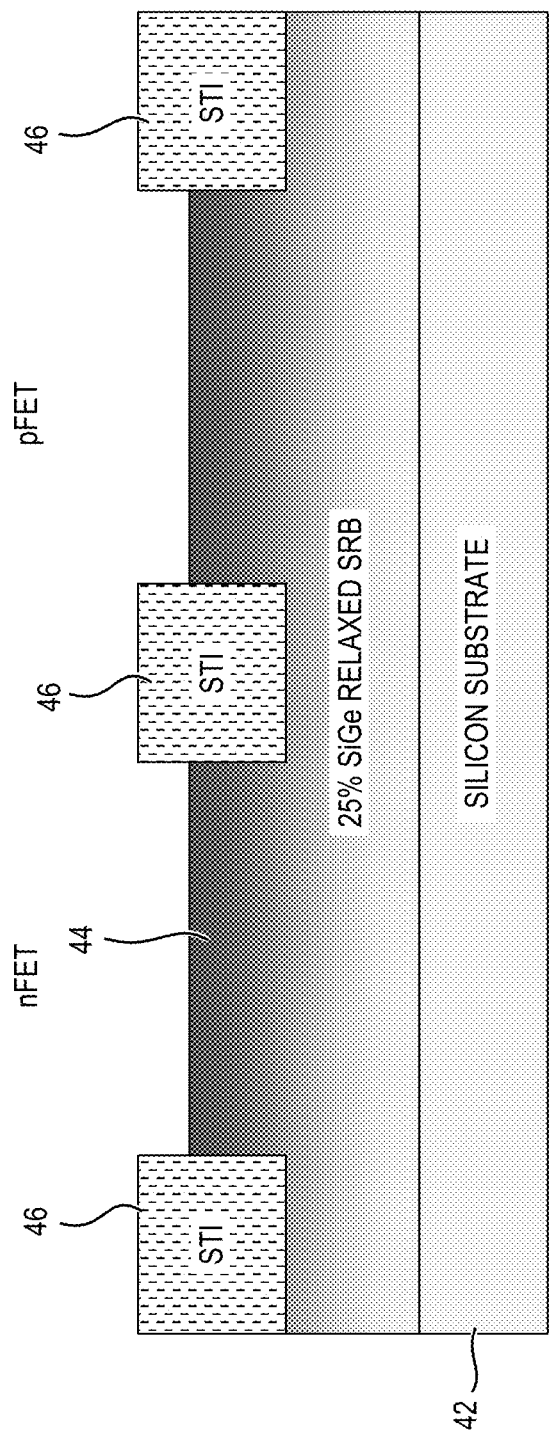
FIG. 6 is a schematic, cross-sectional view thereof showing the formation of active regions on the semiconductor structure shown in FIG. 5.

Referring to FIG. 6, shallow trench isolation (STI) regions 46 are formed in the strain relaxed, $Si_{1-x}Ge_x$ (SRB) layer 44. Trenches are formed in the SRB layer 44 by reactive ion etching. RIE etching of silicon germanium alloys can be conducted using HBr plasma, which provides highly directional anisotropic etching. The trenches are shallower in depth than the thickness of the SRB layer 44 and accordingly have bottom surfaces above the top surface of the substrate 42. Patterning techniques familiar to those skilled in the art facilitate trench formation and subsequent filling of the trenches with one or more electrically insulating material(s) such as silicon dioxide. The filling process can be done by any suitable deposition process (e.g., by CVD, spin-on) followed by removal of the oxide from areas other than the STI regions. CMP (chemical mechanical planarization) to the top of the strain relaxed SRB layer 44 or an etch-back process can be employed to remove excess oxide from the structure. The shallow trench isolation (STI) process provides electrically isolated active areas of the structure regions such as the nFET and pFET regions designated in FIGS. 6-11. The region designated as nFET is intended for the later formation of nFET devices. As known in the art, nFET devices are characterized by n+ source/drain regions while pFET devices have p+ source/drain regions. The pFET region is intended for pFET devices. The formation of STI regions 46 is preferably though not necessarily conducted prior to the steps described below with respect to FIGS. 7-10.

Figure 7:
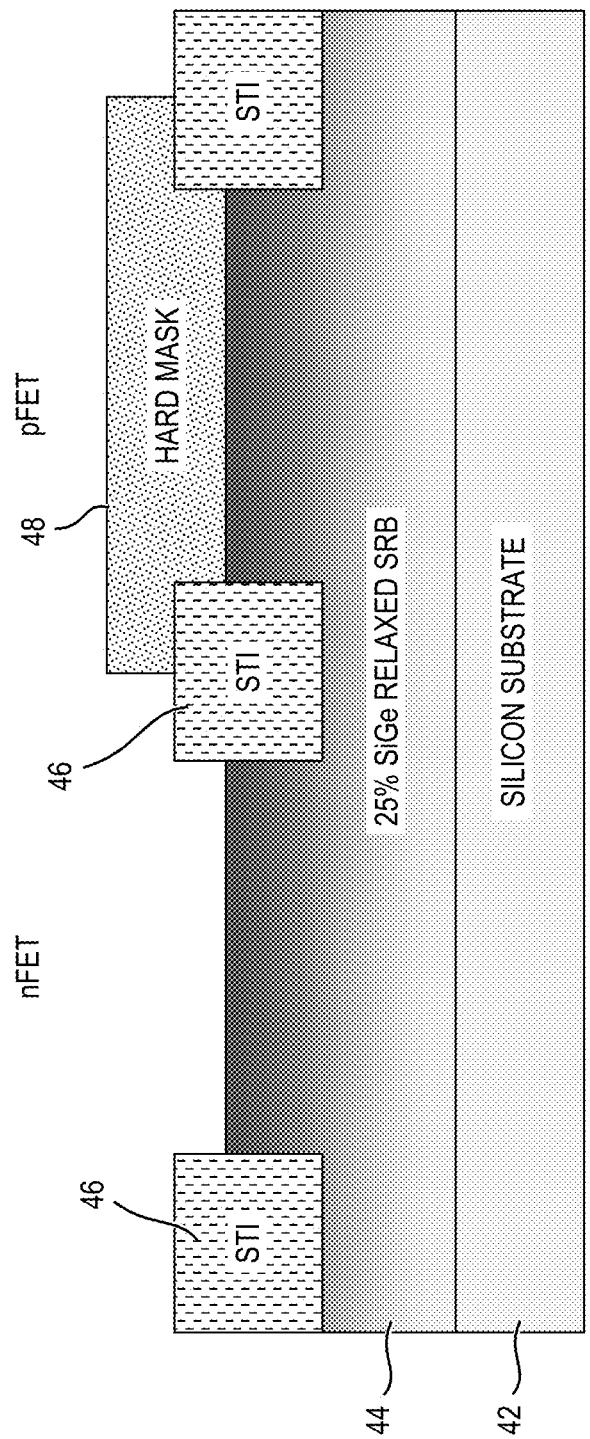
FIG. 7 is a schematic, cross-sectional view showing the formation of a hard mask on the pFET region of the semiconductor structure shown in FIG. 6.

As schematically illustrated in FIG. 7, a hard mask 48 is provided on the pFET region of the SRB layer 44. A nitride ($Si_3N_4$) layer is employed as the hard mask in some exemplary embodiments. Such a mask can be deposited on the SRB layer 44 using conventional deposition techniques such as spin-on coating, chemical vapor deposition (CVD), plasma-assisted CVD, or other known techniques. Conventional processes are further employed, such as applying and patterning a resist, etching, and removing resist, to remove a portion of the hard mask 48 from the nFET region of the structure. The top surface of the SRB layer 44 is accordingly exposed in the nFET region while the pFET region is protected by the mask 48. Hot phosphoric acid may be used to remove the selected portion of the hard mask from the nFET region, resulting in the structure illustrated in FIG. 7.

Figure 8:
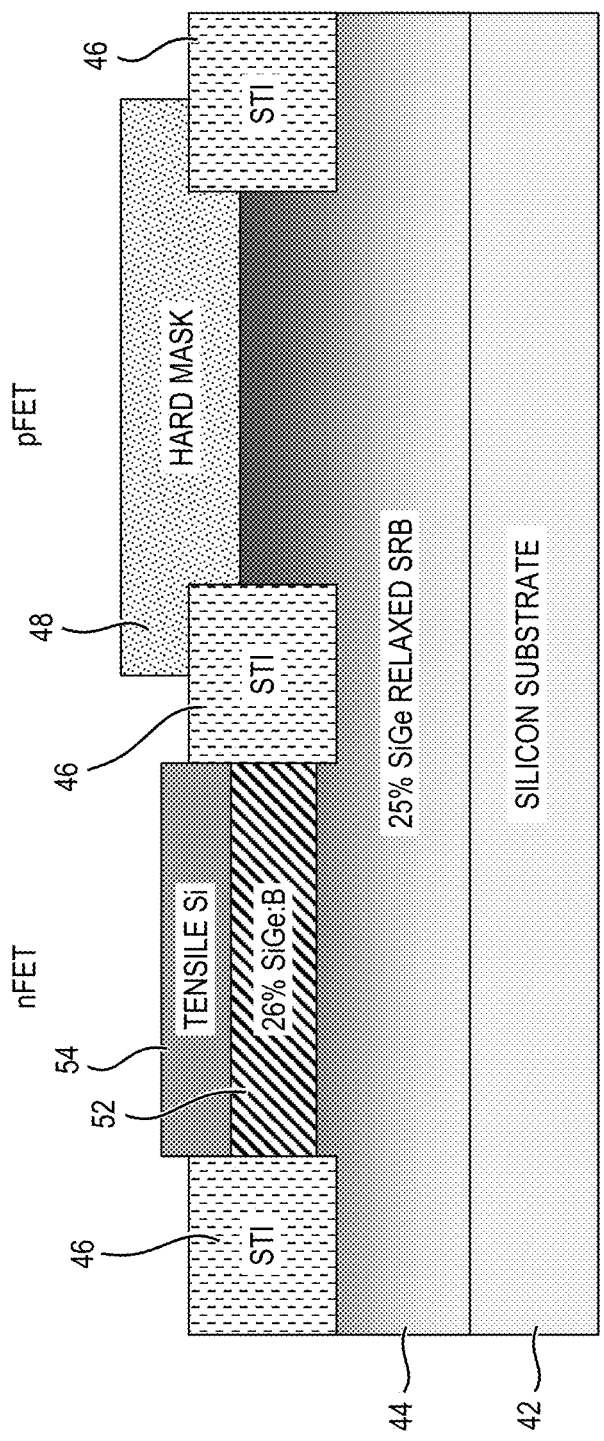
FIG. 8 is a schematic, cross-sectional view showing the formation of a p-doped silicon germanium layer and a silicon layer in a recessed portion of the nFET region of the semiconductor structure shown in FIG. 7.
Figure 9:
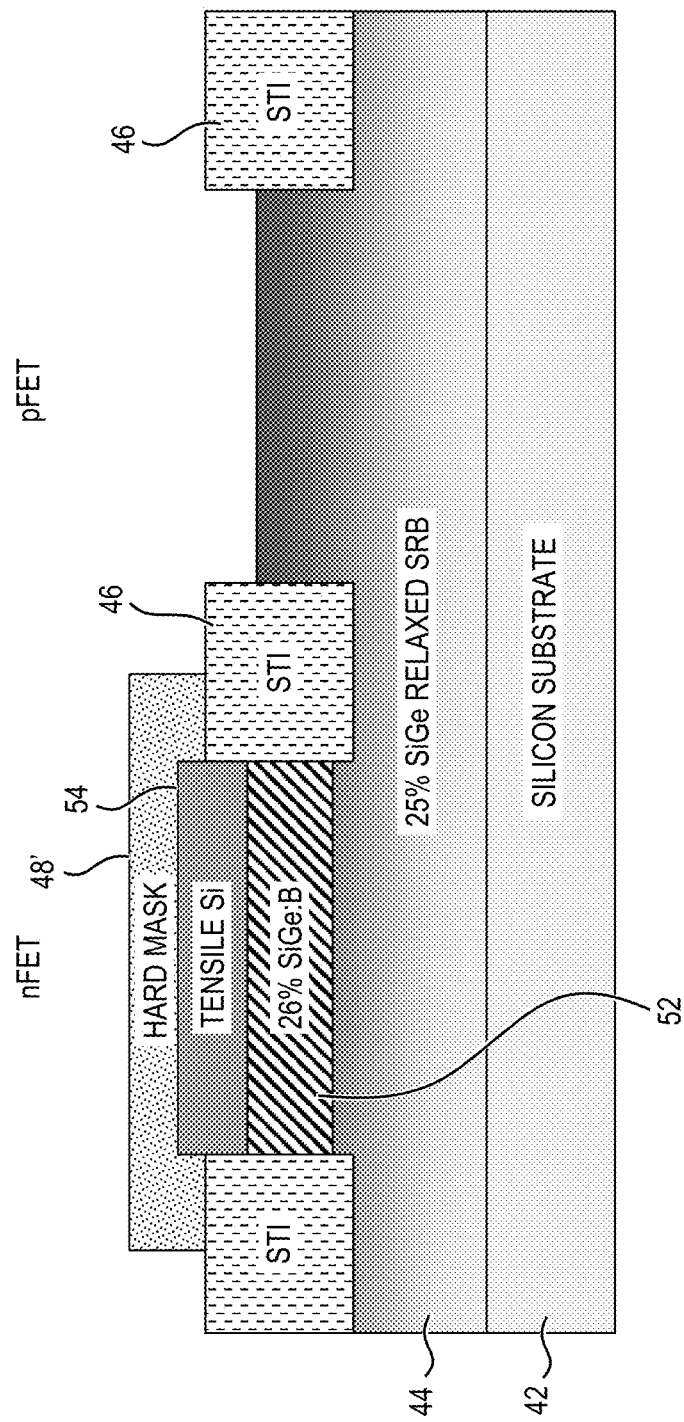
FIG. 9 is a schematic, cross-sectional view showing the formation of a hard mask on the silicon layer of the semiconductor structure shown in FIG. 8.

Referring now to FIG. 8, a first recess is formed in the nFET region of the SRB layer 44. Silicon germanium can be etched in conventional fluorine, bromine or chlorine-based low pressure plasmas. The formation of recesses in silicon germanium using reactive ion etch (ME) processes is known to the art, and any suitable technique may be employed. The etch is timed so that the recess extends only partially through the SRB layer. The STI regions 46 are deeper than the first recess in some embodiments. A p-doped silicon germanium layer 52 is epitaxially grown within the recess on the top surface of the SRB layer. The top surface of the SRB layer is typically pre-cleaned prior to formation of the p-doped layer 52 in accordance with conventional epitaxial pre-clean protocols known to the art. In some exemplary embodiments, the p-type dopant employed is boron and the doping level is 1e18 to 1e19, for example 5e18 ($5\times10^{18}$ $cm^{-3}$). The doping level allows the p-doped layer 52 to function as an isolation punch through stop (PTS) layer. A SiGe:B layer 52 can be epitaxially grown using the same tool and process used to grow the SiGe SRB layer 44 by including diborane with precursors such as silane and germane. The germanium content is the same throughout the SiGe:B layer in one or more embodiments. Boron or other p-type dopant may be included throughout the p-doped silicon germanium layer 52 or only in the top 100-300 nm thereof. The doped silicon germanium layer 52 may have the same or slightly higher (1-2%) germanium content with respect to the surface portion of the SRB layer 44 which it adjoins. In embodiments wherein boron doping is within the range identified above, there should be very little induced strain within the SiGe:B layer 52, allowing the same germanium content as in the SRB layer 44 or just a slightly higher content (one percent or less) to be employed within this layer. In some exemplary embodiments, the layer 52 is represented by $Si_{1-y}Ge_y$:B, the SRB layer 44 has the composition $Si_{1-x}Ge_x$, x=0.25, y is between 0.25 and 0.26, and the thickness of the doped region of the $Si_{1-y}Ge_y$:B layer 52 is between 100-200 nm, and the overall thickness of the $Si_{1-y}Ge_y$:B layer 52 is between two and three microns.

A silicon layer 54 is epitaxially grown on the $Si_{1-y}Ge_y$:B layer 52. The silicon layer 54 can be grown using the same tool and process used to grow the SiGe SRB layer 44 and the underlying p-doped silicon germanium layer 52. The thickness of the silicon layer 54 corresponds to the heights of the fins to be formed in the nFET region, as described below, in embodiments where finned structures are later fabricated. The silicon layer will be under tensile strain as the lattice structure thereof is stretched to match the larger lattice constant of the underlying p-doped silicon germanium layer 52. The layer 52 will function as a punch through stop/well layer for the nFET device(s) formed in the nFET region. Subsequent to completion of the above steps in the nFET region, a hard mask 48' is formed on the silicon layer 54 and the previously formed hard mask 48 is removed from the pFET region to obtain the structure shown in FIG. 9. Hot phosphoric acid may be used to remove the hard mask 48 in embodiments where a nitride hard mask is employed.

A recess is formed in the pFET region of the SRB layer 44 while the nFET region is protected by the hard mask 48'. The same technique used in forming the recess containing the p-doped silicon germanium layer 52 and the silicon layer 54 in the nFET region may again be employed in the pFET region. The recess(es) in the pFET region preferably does not extend deeper than the adjoining STI regions 46. The resulting structure is subjected to an epitaxial prebake at low temperature, for example 750° to 850° C. for two to five minutes (2-5 min.), a pressure range of 10-100 torr, and hydrogen flow rate of 10-50 slm. The exposed surface of the SRB layer 44 can be cleaned using a SiCoNi™ etch, an in-situ HCl etch, or any other suitable pre-clean process wherein temperatures are maintained below about 800-850° C. Pre-cleaning is conducted for five minutes or less. A SiCoNi™ etch is a plasma assisted dry etch process that involves simultaneous exposure of a substrate to hydrogen, $NF_3$ and $NH_3$ plasma by-products. An n-doped silicon layer 56, for example Si:As, is epitaxially grown at 450-750° C., a range of 550-650° being preferred, on the exposed surface of the recessed SRB layer 44. Arsenic is a preferred n-type dopant with respect to phosphorus due to its lower diffusion rate in silicon germanium. The n-doped silicon layer 56 can be grown using the same tool used to grow the p-doped silicon layer 52 and the SRB layer using appropriate precursors, for example silane or tetrasilane with arsine or phosphine. In embodiments where tetrasilane is employed as a precursor, epitaxial growth can take place at about five hundred fifty degrees Centigrade (550° C.). The n-doped silicon layer 56 is grown at a higher temperature range if silane is employed, for example about six hundred degrees Centigrade. In some embodiments, in situ dopants are included only in the last-deposited 100-300 nm of the n-doped silicon layer 56, the remainder of the layer being undoped. The n-doped silicon layer 56 will relax if grown above its critical thickness, building a relaxed template that enables the formation of a strained silicon germanium layer and strained silicon germanium fins having relatively low percentages of germanium compared to those obtained using prior art methods such as that discussed above with respect to FIGS. 1-4. The overall thickness of the relaxed silicon layer 56 is between two and three microns in some exemplary embodiments, thereby providing the relaxed template for subsequent silicon germanium layer growth thereon. The top 100-300 nm of the relaxed silicon layer includes in situ arsenic doping in embodiments where punch through stop (PTS) regions are to be provided for subsequently formed pFET devices. The STI regions 46 are deeper than the p-doped SiGe layer 52 and the n-doped silicon layer 56 in the exemplary embodiment. Each of these layers 52, 56 adjoins a side of an STI region 46 which provides electrical isolation of the layers. More reliable gate stack integration is possible using silicon germanium fins containing, for example, 25% germanium than those containing 50% germanium. A second silicon germanium layer 58 is epitaxially grown on the n-doped silicon layer 56. The second silicon germanium layer 58 has a composition of $Si_{1-z}Ge_z$ wherein z is 0.3 or less in order to facilitate gate stack formation on subsequently fabricated fins. In some embodiments, z is between 0.2 and 0.3 and has substantially the same value as x. The same tool used to grow the SRB layer 44 can be employed to grow the second silicon germanium layer 58. The thickness of the second silicon germanium layer 58 is the same as the thickness of the silicon layer 54 in some embodiments and corresponds to the desired heights of silicon germanium fins to be formed therefrom. The n-doped silicon layer 56, in addition to providing a template for growing a strained silicon germanium layer containing 20-30% germanium, also functions as a punch through stop/well layer for the pFET device(s) later formed in the pFET region. Since diffusion of the n-type dopants (arsenic or phosphorus) is much slower in silicon than in silicon germanium, the problems relating to doping diffusion in the pFET region, as discussed above with respect to FIGS. 1-4, are reduced or eliminated. As discussed above, arsenic dopants are preferred over phosphorus dopants in the n-doped silicon layer 56.

Electrically isolated arrays of parallel silicon and silicon germanium fins 60, 62 are formed, respectively, from the silicon and silicon germanium layers 54, 58 in some embodiments. The STI regions 46 are reduced in height during processing, both intentionally and unintentionally. The fins 60, 62 are accordingly shown as extending above the top surfaces of the STI regions in FIG. 11. The hard mask 48' is removed from the nFET region prior to the formation of the silicon fins 60. The silicon fins 60 adjoin the p-doped silicon germanium layer and, like the silicon layer 54 described above, are under tensile strain. The silicon germanium fins 62 adjoin the n-doped silicon layer 56 and are accordingly under compressive strain. As known in the art, compressively strained channels enhance the performance of PMOS devices while NMOS devices benefit from tensile strain. The process used to form the fins depends on the desired widths of the fins 60, 62. Sidewall image transfer allows the formation of fins having relatively small average widths while conventional photolithographic techniques can be employed for form fins having larger widths. In some embodiments, fin widths are between six and ten nanometers and are formed using sidewall image transfer techniques.

Figure 11:
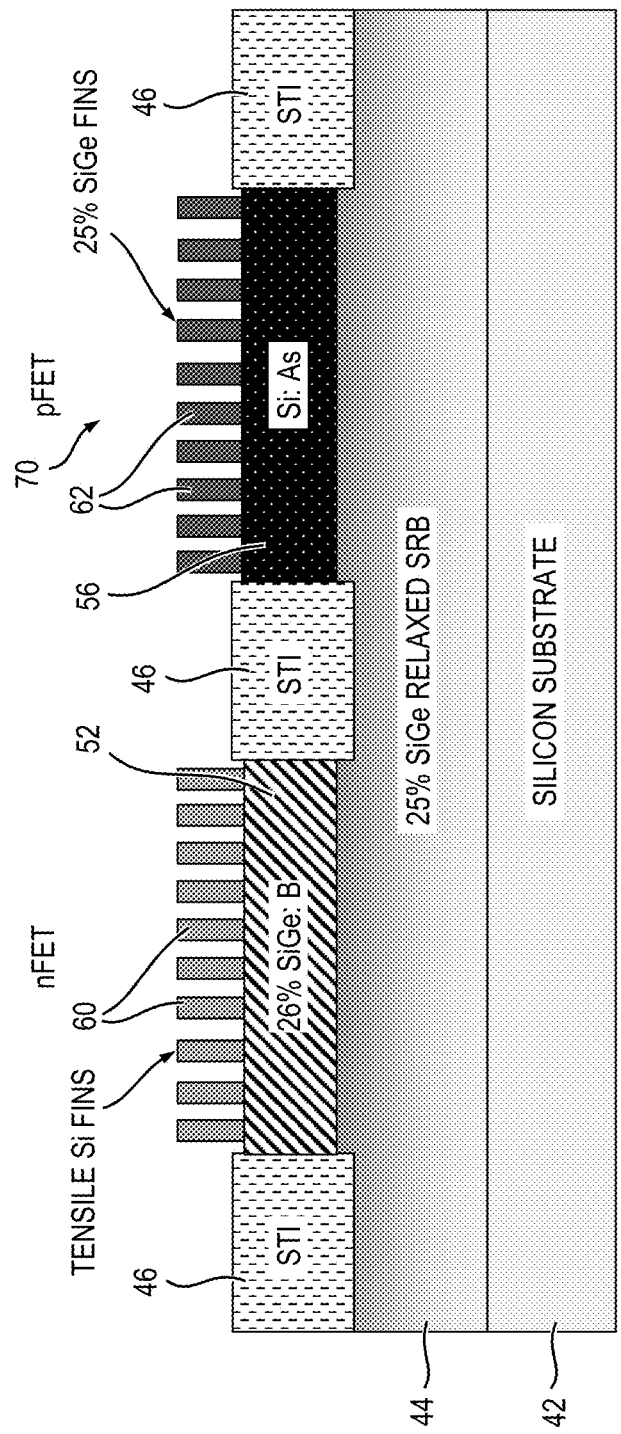
FIG. 11 is a schematic, cross-sectional view showing the formation of silicon and silicon germanium fins in the nFET and pFET regions of the semiconductor structure shown in FIG. 10.

Once the structure 70 shown in FIG. 11 has been obtained, conventional processes may be followed in the fabrication of nFET and pFET devices in the nFET and pFET regions, respectively. A low-k dielectric layer (not shown) is deposited in the trenches between the fins 60, 62, similar to the layer 34 described above with respect to FIG. 4. Active fin heights in some embodiments range from ten to fifty nanometers. In other embodiments, fin heights are at least fifty nanometers. Technology for forming nFET and pFET devices is known to the art and continues to be developed. The gates of FinFETs can be formed using a "gate-first" process wherein a gate stack and spacers are formed prior to selective epitaxial growth on the fins wherein source and drain regions are enlarged. A "gate-last" process may alternatively be employed. Gate-last processes include fabricating a dummy gate, fabricating other elements of the transistor, removing the dummy gate, and replacing the removed dummy gate with actual gate materials. In embodiments where n-type FinFET devices are to be formed, in-situ n-doped silicon may be used to form the epitaxial source/drain structures. In-situ doping of the source/drain structures can be conducted using conventional precursor materials and techniques. Source/drain epitaxy to form p-doped source/drain regions may include the introduction of a boron precursor gas such as diborane. The p-doped source/drain structures may consist essentially of boron-doped silicon germanium in one or more exemplary embodiments. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming the silicon and silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. Boron-doped silicon germanium source/drain regions (not shown) can, for example, be grown on the silicon germanium fins 62 in the fabrication of pFET devices. Phosphorus-doped silicon source/drain regions can be epitaxially grown on the side walls of the silicon fins 60 in the fabrication of nFET devices.

Some of the fabrication steps that follow completion of the structure 70 shown in FIG. 11 include annealing the structure at sufficiently high temperatures and for sufficiently long durations that n-type dopants, if present within a silicon germanium layer underlying the silicon germanium fins 62, would tend to diffuse upwardly into the fins 62 and laterally into the adjoining p-well within the nFET region. As the n-type dopants are instead contained within a silicon n-well underlying the silicon germanium fins 62, the dopant diffusion rate is greatly reduced during subsequent thermal processing steps. Gate stacks including, for example, high-k gate dielectric layers and metal fill materials such as tungsten (W) on titanium nitride (TiN) liners, can be reliably formed on silicon germanium fins 62 as disclosed herein. Such fins 62 have the requisite compressive strain to enhance pFET performance without having the high germanium content characterizing some prior art fins 33 that adversely affect reliable gate stack integration.

FIGS. 5-11, as discussed above, depict exemplary processing steps/stages in the fabrication of exemplary finned semiconductor structures including strain relaxed buffer layers. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling Pt Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

Processes as disclosed above may be employed to form semiconductor devices that do not require fins. Field-effect transistors can be formed, for example, as planar devices or may have raised source/drain regions. Transistors having various configurations continue to be developed and may benefit from structures as disclosed herein.

It is to be appreciated that the various layers and/or regions shown in the accompanying figures may not be drawn to scale. Furthermore, one or more semiconductor layers of a type commonly used in some integrated circuit devices or other layers may not be explicitly shown in a given figure for ease of explanation. This does not imply that the semiconductor layer(s) or other layer(s) not explicitly shown are omitted in the actual integrated circuit device.

Figure 10:
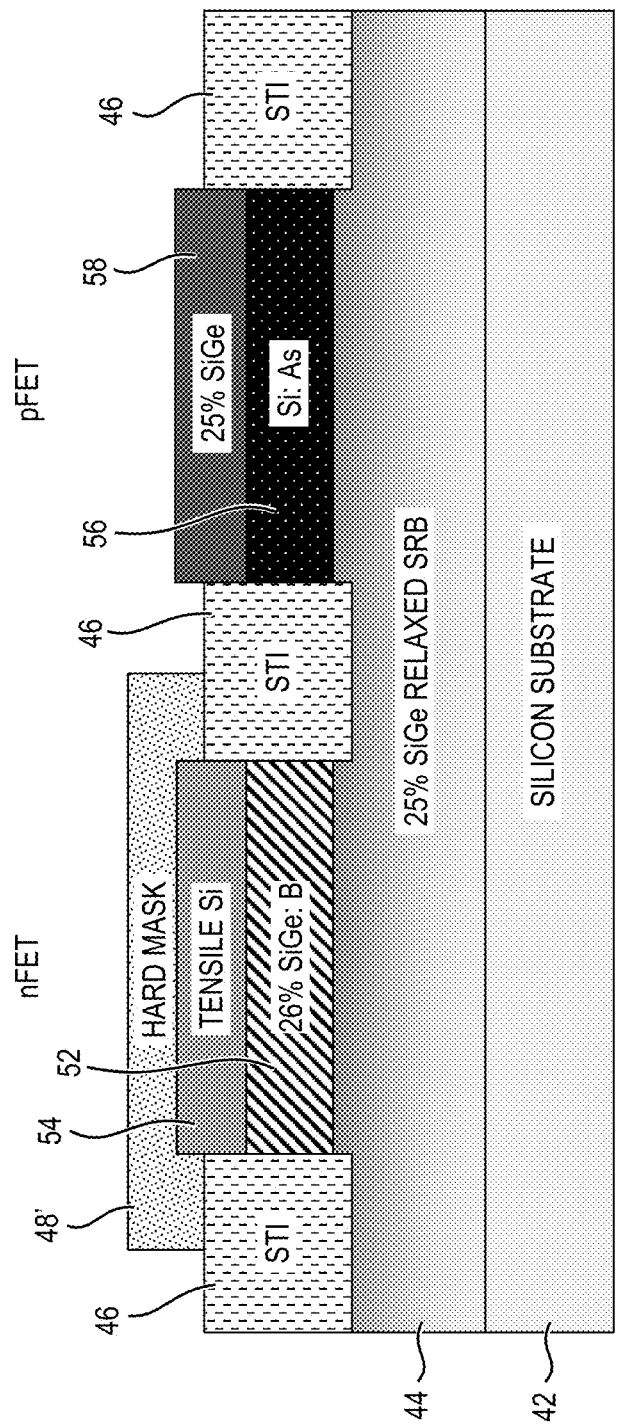
FIG. 10 is a schematic, cross-sectional view showing the formation of an n-doped silicon layer and a silicon germanium layer in a recessed portion of the pFET region of the semiconductor structure shown in FIG. 9.

Given the discussion thus far and with reference to the exemplary embodiments, it will be appreciated that, in general terms, an exemplary fabrication method includes obtaining a structure 40 including a substrate 42 and a strain relaxed silicon germanium buffer layer 44 on the substrate, forming an epitaxial silicon germanium layer 52 on a first region of the strain relaxed buffer layer, and forming a tensile strained layer 54 comprising silicon directly on the epitaxial silicon germanium layer. A relaxed layer 56 comprising silicon is formed on a second region of the strain relaxed buffer layer, such as shown in FIG. 10. A compressively strained silicon germanium layer 58 is formed directly on the relaxed layer. Some embodiments of the method further include introducing n-type dopants in at least a top region of the relaxed layer 56 and p-type dopants in at least a top region of the epitaxial silicon germanium layer 52 during formation (in situ) of the layers 56, 52. The compressively strained silicon germanium layer 58 is formed in adjoining relation to the top region of the relaxed layer 56, which has n-type conductivity, and the tensile strained layer 54 is formed in adjoining relation to the top region of the epitaxial silicon germanium layer 54, which has p-type conductivity. It will be appreciated that dopants can be included throughout these layers 52, 56 or only in the top regions thereof. In some embodiments, the relaxed layer 56 consists essentially of silicon and the n-type dopants and the epitaxial silicon germanium layer 52 consists essentially of silicon germanium having a germanium concentration of thirty percent or less and the p-type dopants. The method further includes electrically isolating the tensile strained layer 54 and the compressively strained silicon germanium layer 58. Structures providing such electrical isolation can be formed prior to formation of the tensile strained layer and the compressively strained silicon germanium layer. In some embodiments, shallow trench isolation regions 46 formed in the SRB layer 44 provide electrical isolation of later-formed tensile strained and compressively strained layers. In some embodiments, the strain relaxed buffer layer 44 has the composition $Si_{1-x}Ge_x$ where x is between 0.2 and 0.3, the epitaxial silicon germanium layer 52 has the composition $Si_{1-y}Ge_y$ where y is equal to or exceeds x by 0.02 or less, and the compressively strained silicon germanium layer 58 has the composition $Si_{1-z}Ge_z$ where z is between 0.2 and 0.3. In some embodiments, both x and z equal 0.25. It will be appreciated that the SRB layer 44 may be graded (stepped or continuously), having a relatively low germanium concentration near the substrate 42 and increasingly higher germanium concentration in the direction of the top surface thereof. The value x in the $Si_{1-x}Ge_x$ SRB layer 44 relates to the germanium concentration in the region of the SRB layer that adjoins the epitaxial silicon germanium layer 52 grown thereon. A germanium concentration of the compressively strained silicon germanium layer 58 between twenty and thirty percent facilitates later gate integration. The exemplary method may further include electrically isolating the first and second regions of the SRB layer. FIG. 6 schematically illustrates the electrical isolation of nFET and pFET regions in the SRB layer. In some embodiments, the fabrication process includes forming first and second recesses extending respectively within the first and second regions of the strain relaxed buffer layer. The epitaxial silicon germanium layer 52 is formed within the first recess, as described above with respect to FIG. 8. The relaxed layer is formed within the second recess, such as described with respect to FIG. 10. The method further includes forming the tensile strained layer within the first recess and the compressively strained silicon germanium layer within the second recess in some embodiments such that the tensile strained layer 54 and the compressively strained silicon germanium layer 58 are electrically isolated. A first array of parallel fins 60 is formed from the tensile strained layer 54 and a second array of parallel fins 62 is formed from the compressively strained silicon germanium layer 58 in some embodiments. The first array of fins is electrically isolated from the second array. The method may further include forming one or more nFET devices using the first array of parallel fins 60 and one or more pFET devices using the second array of parallel fins 62. The first and second arrays of parallel fins are formed in some embodiments such that the epitaxial silicon germanium layer 52 is functional as a punch through stop for the one or more nFET devices and the relaxed layer 56 is functional as a punch through stop for the one or more pFET devices. The relaxed layer 56 may consist essentially of silicon and may be formed by epitaxially growing the relaxed layer to a thickness wherein it relaxes to the lattice constant of silicon. It thereby forms a template for growing the strained silicon germanium layer thereon. The incorporation of n-type dopants such as arsenic, preferably in situ as opposed to implantation, allows the relaxed layer 56 to additionally function as a punch through stop for a subsequently formed pFET device. In some embodiments, the substrate 42 consists essentially of monocrystalline silicon and the strain relaxed buffer layer consists essentially of silicon and germanium. The substrate 42 is a bulk silicon wafer in some embodiments.

It will also be appreciated that an exemplary semiconductor structure is provided that includes a strain relaxed silicon germanium buffer layer 44, a p-doped silicon germanium layer 52 on a first region of the strain relaxed buffer layer, and a relaxed, n-doped layer 56 comprising silicon on a second region of the strain relaxed buffer layer. A tensile strained layer 54 comprising silicon is in direct contact with the p-doped silicon germanium layer. A compressively strained silicon germanium layer 58 directly contacts the relaxed, n-doped layer 56 and is electrically isolated from the tensile strained layer 54. Exemplary semiconductor structures are schematically illustrated in FIGS. 10 and 11. The strain relaxed buffer layer has the composition $Si_{1-x}Ge_x$ where x is between 0.2 and 0.3 and the compressively strained silicon germanium layer has the composition $Si_{1-z}Ge_z$ where z is between 0.2 and 0.3. The p-doped silicon germanium layer may have the composition $Si_{1-y}Ge_y$ wherein y is equal to or exceeds x by 0.02 or less. In some exemplary embodiments, the n-doped layer 56 consists essentially of silicon and includes n-type dopants in at least a region of the n-doped layer that adjoins the compressively strained silicon germanium layer 58. The tensile strained layer 54 in some embodiments includes a first array of parallel silicon fins 60 and the compressively strained silicon germanium layer comprises a second array of parallel silicon germanium fins 62. The first array of fins is electrically isolated from the second array in embodiments of the semiconductor structure that include fins. FIG. 11 shows an exemplary semiconductor structure 70 including electrically isolated arrays of fins. The p-doped silicon germanium layer 52 is configured as a first punch through stop for the first array of parallel silicon fins 60 and the relaxed, n-doped layer 56 is configured as a second punch through stop for the second array of parallel silicon germanium fins 58. In some embodiments, the tensile strained semiconductor layer 54 consists essentially of silicon, the compressively strained semiconductor layer 58 consists essentially of silicon germanium, and z is substantially equal to x. A shallow trench isolation region 46 may be used for electrically isolating the first array of parallel silicon fins 60 from the second array of parallel silicon germanium fins 62. The p-doped silicon germanium layer 52 adjoins a first side of the shallow trench isolation region and the n-doped, silicon-containing layer 56 adjoins a second side of the shallow trench isolation region.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having electronic devices and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
a strain relaxed silicon germanium buffer layer;
a p-doped silicon germanium layer on a first region of the strain relaxed silicon germanium buffer layer;
a relaxed, n-doped layer comprising silicon on a second region of the strain relaxed silicon germanium buffer layer;
a tensile strained layer comprising silicon directly on the p-doped silicon germanium layer;
a compressively strained silicon germanium layer directly on the relaxed, n-doped layer and electrically isolated from the tensile strained layer; and
first and second recesses extending respectively within the first and second regions of the strain relaxed silicon germanium buffer layer, wherein the p-doped silicon germanium layer is formed within the first recess and the relaxed, n-doped layer is formed within the second recess,
wherein the tensile strained layer is formed within the first recess and the compressively strained silicon germanium layer is formed within the second recess.

2. The semiconductor structure of claim 1, wherein the strain relaxed silicon germanium buffer layer has at least a top region having the composition $Si_{1-x}Ge_x$ where x is between 0.2 and 0.3 and the compressively strained silicon germanium layer has the composition $Si_{1-z}Ge_x$ where z is between 0.2 and 0.3.

3. The semiconductor structure of claim 2, wherein the p-doped silicon germanium layer has the composition $Si_{1-y}Ge_y$, and y is equal to x or exceeds x by 0.02 or less.

4. The semiconductor structure of claim 2, wherein the n-doped layer consists essentially of silicon including n-type dopants in at least a region adjoining the compressively strained silicon germanium layer.

5. The semiconductor structure of claim 2, wherein the tensile strained layer comprises a first array of parallel silicon fins, the compressively strained silicon germanium layer comprises a second array of parallel silicon germanium fins, the first array being electrically isolated from the second array, the p-doped silicon germanium layer being configured as a first punch through stop for the first array of parallel silicon fins, the n-doped layer being configured as a second punch through stop for the second array of parallel silicon germanium fins.

6. The semiconductor structure of claim 5, wherein the tensile strained semiconductor layer consists essentially of silicon, the compressively strained semiconductor layer consists essentially of silicon germanium, and z is substantially equal to x.

7. The semiconductor structure of claim 5, further including a shallow trench isolation region electrically isolating the first array of parallel silicon fins from the second array of parallel silicon germanium fins, the p-doped silicon germanium layer adjoining a first side of the shallow trench isolation region and the n-doped layer adjoining a second side of the shallow trench isolation region.

8. The semiconductor structure of claim 1, further comprising a shallow trench isolation region electrically isolating the first and second regions of the strain relaxed silicon germanium buffer layer, wherein the first and second recesses are formed having respective depths in the strain relaxed silicon germanium buffer layer that are shallower than a depth of the shallow trench isolation region in the strain relaxed silicon germanium buffer layer.

* * * * *